United States Patent
Campbell et al.

(10) Patent No.: US 7,298,618 B2
(45) Date of Patent: Nov. 20, 2007

(54) COOLING APPARATUSES AND METHODS EMPLOYING DISCRETE COLD PLATES COMPLIANTLY COUPLED BETWEEN A COMMON MANIFOLD AND ELECTRONICS COMPONENTS OF AN ASSEMBLY TO BE COOLED

(75) Inventors: Levi A. Campbell, New Paltz, NY (US); Richard C. Chu, Hopewell Junction, NY (US); Michael J. Ellsworth, Jr., Lagrangeville, NY (US); Madhusudan K. Iyengar, Kingston, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 11/258,316

(22) Filed: Oct. 25, 2005

(65) Prior Publication Data

US 2007/0091570 A1  Apr. 26, 2007

(51) Int. Cl.
*H05K 7/20* (2006.01)
*F28F 7/00* (2006.01)
*H01L 23/34* (2006.01)

(52) U.S. Cl. .................... 361/699; 165/80.4; 174/15.1; 361/702; 257/719

(58) Field of Classification Search ................ 361/699
See application file for complete search history.

(56) References Cited

U.S. PATENT DOCUMENTS 4,468,717 A  8/1984  Mathias et al. ............ 361/382

4,558,395 A * 12/1985  Yamada et al. ............ 361/699

(Continued)

FOREIGN PATENT DOCUMENTS

JP  01 036057 A  2/1989

OTHER PUBLICATIONS

Campbell et al, "Cooling System and Method Employing a Closed Loop Coolant Path and Micro-Scaled Cooling Structure with an Electronics Subsystem of an Electronics Rack," U.S. Appl. No. 11/008,771, filed Dec. 9, 2004.

(Continued)

*Primary Examiner*—Gregory D Thompson
(74) *Attorney, Agent, or Firm*—Lily Neff, Esq.; Kevin P. Radigan, Esq.; Heslin Rothenberg Farley & Mesiti PC

(57) ABSTRACT

Cooling apparatuses and methods are provided for cooling an assembly including a planar support structure supporting multiple electronics components. The cooling apparatus includes: multiple discrete cold plates, each having a coolant inlet, coolant outlet and at least one coolant carrying channel disposed therebetween; and a manifold for distributing coolant to and exhausting coolant from the cold plates. The cooling apparatus also includes multiple flexible hoses connecting the coolant inlets of the cold plates to the manifold, as well as the coolant outlets to the manifold, with each hose segment being disposed between a respective cold plate and the manifold. A biasing mechanism biases the cold plates away from the manifold and towards the electronics components, and at least one fastener secures the manifold to the support structure, compressing the biasing mechanism, and thereby forcing the parallel coupled cold plates towards their respective electronics components to ensure good thermal interface.

20 Claims, 15 Drawing Sheets

U.S. PATENT DOCUMENTS

| | | | |
|---|---|---|---|
| 4,644,385 A | * | 2/1987 | Nakanishi et al. .......... 257/713 |
| 4,748,495 A | | 5/1988 | Kucharek .................... 361/82 |
| 4,791,983 A | * | 12/1988 | Nicol et al. ................ 165/80.4 |
| 4,809,134 A | * | 2/1989 | Tustaniwskyj et al. ..... 361/699 |
| 5,022,462 A | * | 6/1991 | Flint et al. ................. 165/80.4 |
| 5,144,531 A | | 9/1992 | Go et al. .................... 361/382 |
| 5,309,319 A | * | 5/1994 | Messina .................... 361/699 |
| 5,329,419 A | * | 7/1994 | Umezawa ................... 361/699 |
| 5,349,498 A | | 9/1994 | Tanzer et al. ............... 361/689 |
| 5,388,635 A | * | 2/1995 | Gruber et al. ............. 165/80.4 |
| 5,774,334 A | | 6/1998 | Kawamura et al. ......... 361/699 |
| 6,053,238 A | | 4/2000 | Goth et al. |
| 6,330,157 B1 | | 12/2001 | Bezama et al. ............. 361/704 |
| 6,351,384 B1 | | 2/2002 | Daikoku et al. ............ 361/704 |
| 6,366,461 B1 | | 4/2002 | Pautsch et al. ............. 361/690 |
| 6,587,343 B2 | | 7/2003 | Novotny et al. ............ 361/698 |
| 6,754,076 B2 | | 6/2004 | Cox et al. ................... 361/699 |
| 6,826,923 B2 | | 12/2004 | Nakano et al. ............. 62/259.2 |
| 2004/0080912 A1 | | 4/2004 | Goth et al. ................. 361/699 |

OTHER PUBLICATIONS

M.A. LoPresti, "Militarized Drawer for Conduction Cooled VME Modules," IBM Technical Disclosure Bulletin, vol. 37, No. 5, (pp. 109-110) (May 1994).

Anonymous, "Modules With Miniature Cold Plates Mounted Directly on Chips", IBM Technical Disclosure Bulletin, vol. 30, No. 6, pp. 366-367 (Nov. 1, 2987).

* cited by examiner

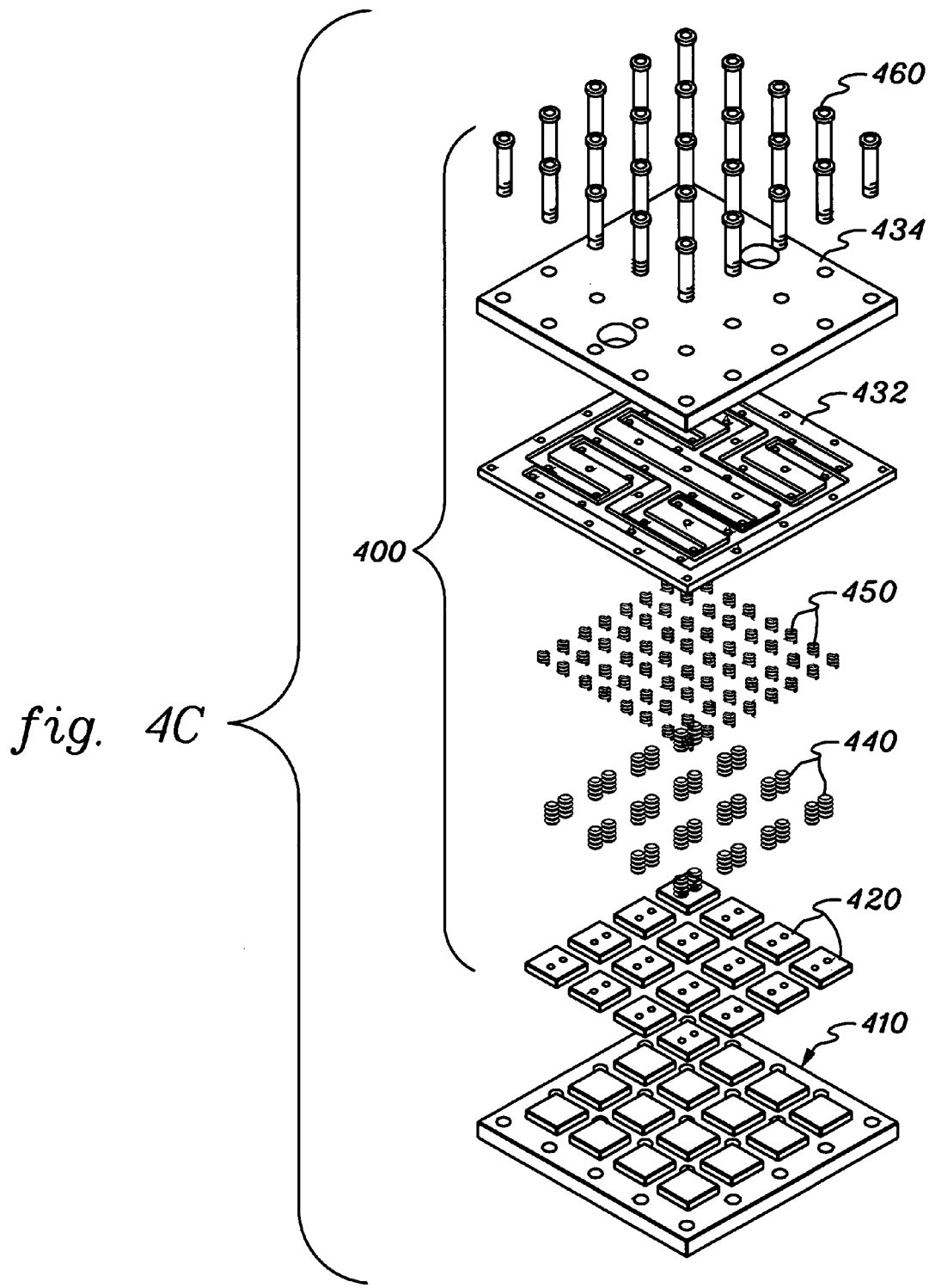

COOLING APPARATUSES AND METHODS EMPLOYING DISCRETE COLD PLATES COMPLIANTLY COUPLED BETWEEN A COMMON MANIFOLD AND ELECTRONICS COMPONENTS OF AN ASSEMBLY TO BE COOLED

CROSS-REFERENCE TO RELATED APPLICATIONS

This application contains subject matter which is related to the subject matter of the following applications, which are assigned to the same assignee as this application and which are hereby incorporated herein by reference in their entirety:

"Cooling System and Method Employing a Closed Loop Coolant Path and Micro-Scaled Cooling Structure within an Electronics Subsystem of an Electronics Rack", Campbell et al., Ser. No. 11/008,771, filed Dec. 9, 2004; and "Cooling Apparatus and Method Employing Discrete Cold Plates Disposed Between a Module Enclosure and Electronics Components to be Cooled," Campbell et al., Ser. No. 11/258,314, filed Oct. 10, 2005.

TECHNICAL FIELD

The present invention relates to cooling apparatuses and methods for removing heat generated by electronics components (e.g., devices, modules, systems, etc.) and to methods of constructing such cooling apparatuses. More particularly, the present invention relates to cooling apparatuses and methods for extracting heat from heat generating electronics components of an electronics assembly, such as a plurality of multichip and/or single-chip modules disposed on a support structure.

BACKGROUND OF THE INVENTION

As is known, operating electronic devices produce heat. This heat should be removed from the devices in order to maintain device junction temperatures within desirable limits. Failure to remove the heat thus produced results in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, power density (Watts/$cm^2$) increases, resulting in the need to remove more heat from a given size chip or module. Additionally, a common packaging configuration for many large computer systems today is a multi-drawer rack, with each drawer containing one or more processor modules along with associated electronics, such as memory, power and hard drive devices. These drawers are removable units so that in the event of failure of an individual drawer, the drawer may be removed and replaced in the field. A problem with this configuration is the increase in heat flux at the electronics drawer level. The above-noted trends have combined to create applications where it is no longer desirable to remove heat from modern devices solely by traditional air cooling methods, such as by using traditional air cooled heat sinks. These trends are likely to continue, furthering the need for alternatives to traditional air cooling methods.

One approach to avoiding the limitations of traditional air cooling is to use a cooling liquid. As is known, different liquids provide different cooling capabilities. In particular, liquids such as refrigerants or other dielectric fluids (e.g., fluorocarbon fluid) exhibit relatively poor thermal conductivity and specific heat properties, i.e., when compared to liquids such as water or other aqueous fluids. Dielectric liquids have an advantage, however, in that they may be placed in direct physical contact with electronic devices and interconnects without adverse affects such as corrosion or electrical short circuits.

Other cooling liquids, such as water or other aqueous fluids, exhibit superior thermal conductivity and specific heat compared to dielectric liquids. Water-based coolants, however, must be kept from physical contact with electronics components and interconnects, since corrosion and electrical short circuit problems are likely to result from contact. Various methods have been disclosed for using water-based coolants, while providing physical separation between the coolant and the electronics components. For example, a cold plate can be employed wherein coolant passes through channels within the cold plate, and the plate is physically coupled to the one or more electronics components, thereby facilitating the extraction of heat therefrom.

Notwithstanding the above, there remains a large and significant need to provide further enhanced cooling apparatuses and methods of fabrication thereof for facilitating cooling of electronic assemblies such as electronic modules disposed on a common support structure, e.g., in a multi-drawer electronics rack.

SUMMARY OF THE INVENTION

The shortcomings of the prior art are overcome and additional advantages are provided through the provision of a cooling apparatus for facilitating cooling of an electronics assembly comprising a support structure supporting multiple heat generating electronics components to be cooled. The cooling apparatus includes: multiple discrete cold plates sized and spaced to couple to the electronics components, with each cold plate being configured to couple to a respective electronics component, and each cold plate being a coolant-cooled cold plate including a coolant inlet and a coolant outlet with at least one coolant carrying channel disposed between the coolant inlet and coolant outlet; a common manifold for distributing coolant to the coolant inlets of the cold plates and for receiving coolant from the coolant outlets of the cold plates; multiple flexible hose segments connecting in fluid communication the coolant inlets of the multiple cold plates to the manifold, and connecting in fluid communication the coolant outlets of the multiple cold plates to the manifold, each flexible hose segment being disposed between a respective cold plate and the manifold; at least one biasing mechanism disposed between the multiple cold plates and the manifold for biasing the multiple cold plates away from the manifold and towards the multiple electronics components when the cooling apparatus is in use; and at least one fastener for securing the manifold to the support structure of the electronics assembly, thereby compressing the biasing mechanism and forcing the cold plates towards the electronics components to ensure good thermal interface of the cold plates to their respective electronics components.

In another aspect, a cooled electronics system is provided which includes an electronics assembly having a support structure supporting multiple heat generating electronics components to be cooled, and a cooling apparatus for facilitating cooling of the electronics components. The cooling apparatus includes: multiple discrete cold plates sized and spaced to couple to the electronics components, with each cold plate being configured to couple to a respective electronic component, and each cold plate being a coolant-cooled cold plate and including a coolant inlet and a coolant outlet with at least one coolant carrying channel disposed between the coolant inlet and the coolant outlet; a common manifold for distributing coolant to the coolant inlets of the multiple cold plates and for receiving coolant from the coolant outlets of the multiple cold plates; multiple flexible hose segments connecting in fluid communication the coolant inlets of the multiple cold plates to the manifold, and connecting in fluid communication the coolant outlets of the multiple cold plates to the manifold, each flexible hose segment being disposed between a respective cold plate and the manifold; at least one biasing mechanism disposed between the multiple cold plates and the manifold for biasing the multiple cold plates away from the manifold and towards the multiple heat generating electronics components when the cooling apparatus is in use; and at least one fastener for securing the manifold to the support structure of the electronics assembly, thereby compressing the biasing mechanism and forcing the cold plates towards the electronics components to ensure good thermal interface of the cold plates to their respective electronics components.

In a further aspect, a method of fabricating a cooling apparatus is provided for facilitating cooling of an electronics assembly having a support structure supporting multiple heat generating electronics components to be cooled. The method includes: providing multiple discrete cold plates sized and spaced to couple to the electronics components, with each cold plate being configured to couple to a respective electronics component, and each cold plate being a coolant-cooled cold plate including a coolant inlet and a coolant outlet with at least one coolant carrying channel disposed between the coolant inlet and the coolant outlet; providing a common manifold for distributing coolant to the coolant inlets of the multiple cold plates and for receiving coolant from the coolant outlets of the multiple cold plates; coupling the multiple cold plates to the manifold employing multiple flexible hose segments to connect in fluid communication the coolant inlets of the multiple cold plates to the manifold and the coolant outlets of the multiple cold plates to the manifold; employing a biasing mechanism coupled to the multiple cold plates to bias the multiple cold plates away from the manifold, and towards the multiple heat generating electronics components when the cooling apparatus is in use; and securing the manifold to the support structure of the electronics assembly and compressing the biasing mechanism, thereby forcing each cold plate towards its respective electronics component to ensure good thermal interface of the cold plate to its respective electronics component.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 4C is an exploded isometric view of the cooling apparatus and electronics assembly of FIG. 4A, in accordance with an aspect of the present invention;

BEST MODE FOR CARRYING OUT THE INVENTION

As used herein, "electronics subsystem" comprises any housing, compartment, drawer, blade, etc., containing one or more heat generating components of a computer system or other electronics system requiring cooling. The term "electronics rack" includes any frame, rack, blade server system, etc., having a heat generating component of a computer system or electronics system, and may be, for example, a stand alone computer processor having high, mid or low end processing capability. In one embodiment, an electronics rack may comprise multiple electronics subsystems, each having one or more heat generating electronics components requiring cooling.

Each "heat generating electronics component" may comprise a multichip electronics module, a single-chip electronics module, one or more unpackaged integrated circuit die, etc. A "support structure" for the electronics assembly is in one embodiment a substantially planar structure, which may comprise a board, a stiffener, a substrate, etc. A "biasing mechanism" refers to any biasing structure, such as one or more springs, leafs, etc., with the four spring arrangement per cold plate being illustrated in the examples provided herein by way of example only.

One example of coolant for a cooling apparatus in accordance with an aspect of the present invention is water. However, the concepts disclosed herein are readily adapted to use with other types of coolant. For example, one or more of the coolants may comprise a brine, a fluorocarbon liquid, a liquid metal, or other similar coolant, or a refrigerant, while still maintaining the advantages and unique features of the present invention.

As noted briefly above, power levels in computer equipment such as processors are rising to a level beyond simple air cooling capacity. The electronics components might thus be water cooled. Heat dissipated by a processor can be transferred to water via a water cooled cold plate. Facility water typically available at customer locations (i.e., data centers) is often not suitable for use in cold plates. First, condensation formation is a concern as the temperature of the data center water, ranging from 7° C. to 15° C., is far below the room dew point (typically 17-28° C.). Second, the relatively poor quality of the facility water (in chemistry, cleanliness, etc.) impacts system reliability. It is therefore desirable to utilize a water cooling/conditioning unit that circulates higher quality water to/from the electronics subsystems and rejects the heat to the data center water. As used herein, "facility water" or "facility coolant" refers to, in one example, this data center water or coolant, while "system coolant" refers to cooled/conditioned coolant circulating between a coolant distribution unit and the electronics subsystems to be cooled.

Figure 1:
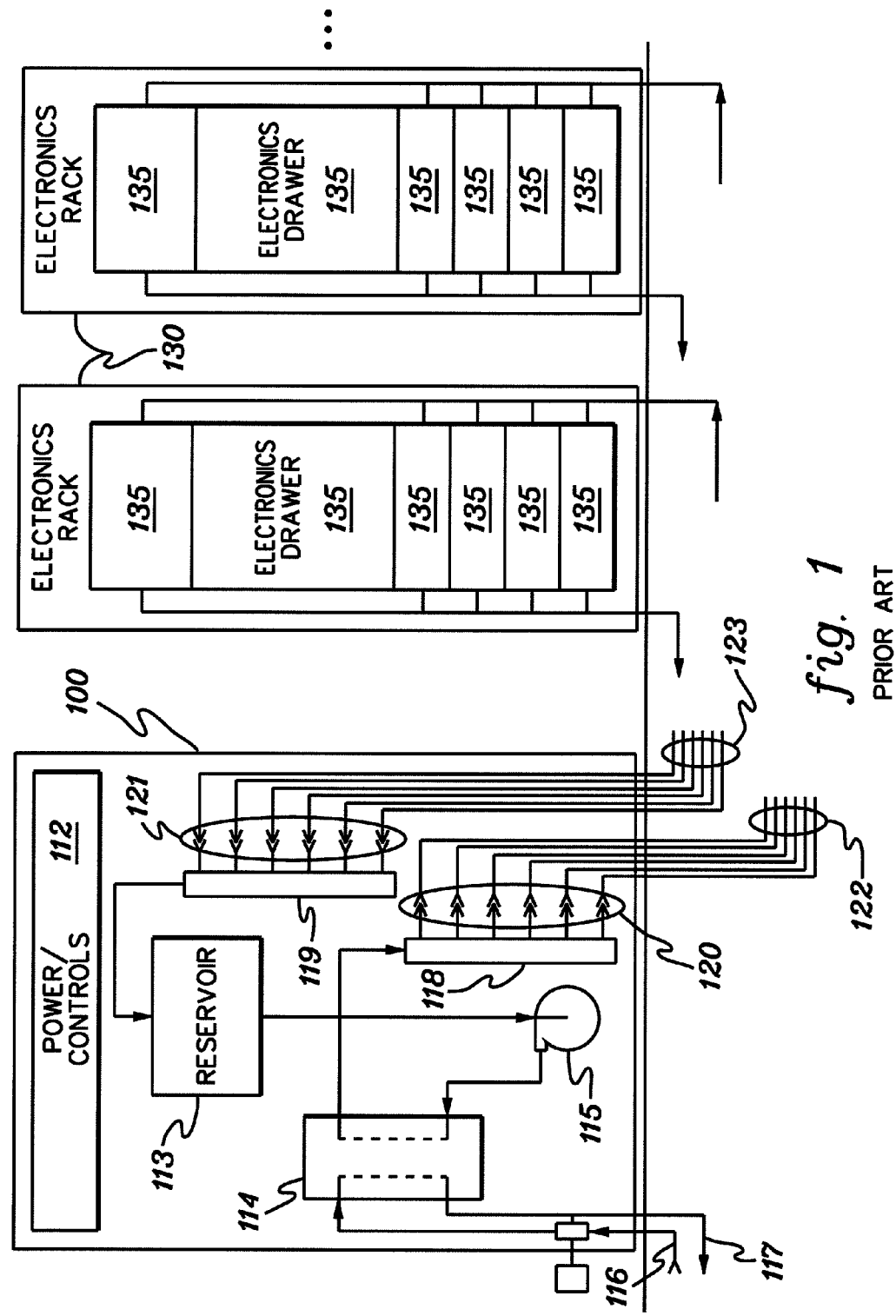
FIG. 1 depicts a conventional coolant distribution unit, such as a Computer Room Water Conditioning Unit (CR-WCU), for cooling one or more electronics racks of a computing environment.

Referring now to the drawings, FIG. 1 depicts one embodiment of a coolant distribution unit 100 for a computer room. The coolant distribution unit is conventionally a relatively large unit comparable in size to an electronics frame. Within the cooling unit 100 is a power/control element 112, a reservoir/expansion tank 113, a heat exchanger 114, a pump 115 (often accompanied by a redundant second pump), facility water (or site or customer service water or coolant) inlet 116 and outlet 117 supply pipes, a supply manifold 118 directing water to the electronics frames 130 via couplings 120 and lines 122, and a return manifold 119 directing water from the electronics frames 130, via lines 123 and couplings 121. Each electronics rack includes multiple electronics drawers or multiple electronics subsystems 135.

Figure 2:
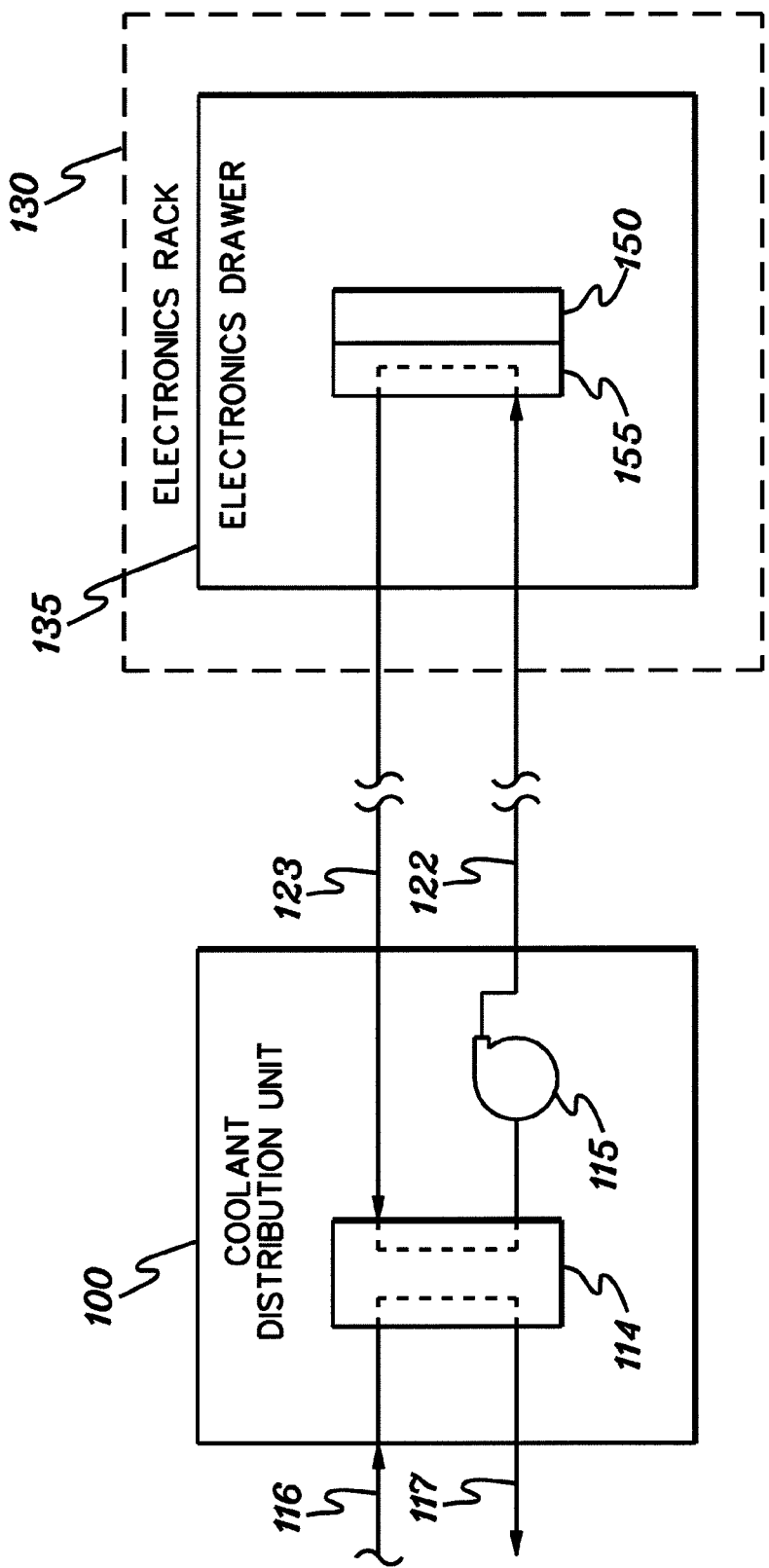
FIG. 2 is a schematic of one embodiment of an electronics drawer of an electronics rack and the cooling system therefor employing a coolant distribution unit with a facility coolant loop and a system coolant loop, which may include one or more cooling apparatuses, in accordance with an aspect of the present invention.

FIG. 2 schematically illustrates operation of the cooling system of FIG. 1, wherein a liquid cooled cold plate 155 is shown coupled to an electronic device 150 of electronics drawer 135 within electronics rack 130. Heat is removed from electronic device 150 via the system coolant pumped via pump 115 through cold plate 155 within the system coolant loop defined by heat exchanger 114 of coolant distribution unit 100, lines 122, 123 and cold plate 155. The system coolant loop and coolant distribution unit are designed to provide coolant of a controlled temperature and pressure, as well as controlled chemistry and cleanliness to the electronics. Furthermore, the system coolant is physically separate from the less controlled facility coolant in lines 116, 117 to which heat is ultimately transferred.

As noted, as the demand for increased computing cycles per unit time and volume increases, systems are driven to more compact and highly parallel processor arrangements. One common design is a planar electronic assembly comprising multiple electronics components, such as single-chip modules and/or multichip modules. As these modules increase in power, liquid coolant becomes more and more necessary to dissipate the heat generated by the modules. One cooling approach would be a series-flow arrangement through modules of a planar package (i.e., electronics assembly) while coolant in other planar packages, sometimes referred to in the art as nodes, might flow in parallel with one another. A common inlet manifold could feed all nodes and a common return manifold might handle coolant return, with separate hoses connecting a first series cold plate to the manifold, and then to the next cold plate, etc., until finally a last series cold plate is connected to the return manifold, all in parallel with the other nodes in the system. The drawbacks of such a solution include the existence of many hoses for each electronics assembly (node), causing clutter and increasing the possibility of leaks, the high pressure requirements due to the serial flow arrangement on each node, the large coolant temperature rise when passing serially through components of a node, resulting in relatively low thermal performance for the last serial cold plate, and the maintenance complexity due to the clutter of hoses.

The present invention addresses these drawbacks of a serial solution by achieving highly parallel flow at the node level without increasing the amount of hoses required to the node, thereby resulting in a lower overall pressure requirement and ensuring that the thermal performance across all modules in an electronics assembly (e.g., node) is reasonably uniform. Further, the present invention allows for module misorientation, e.g., different component heights and/or angular orientations, while still reducing hose clutter and allowing for easier maintenance than a serial solution such as outlined above.

Advantageously, the present invention employs rigid cold plates as heat transfer structures with high thermal efficiency, along with a common distribution manifold to permit simplified removal/maintenance of the cooling apparatus from the electronics assembly. Within each node, the rigid cold plates are flexibly coupled to the common manifold, thereby allowing the cold plates to achieve good thermal contact with the respective electronics components, notwithstanding that one or more dimensions or orientations of the components may vary. In one embodiment, each electronics component is cooled via a single associated cold plate, and each cold plate is fed coolant via a single flexible inlet hose and exhausts coolant via a single flexible outlet hose connection to the common manifold. The cooling apparatus further includes a biasing mechanism, such as a system of springs, to allow compliance of the cold plates. The cooling apparatus can be scaled to any number of electronics components (e.g., processor modules) in an electronics assembly, and is designed to conform to differences in height and orientation among the electronics components through the use of the flexible hoses and biasing mechanism(s) disposed between the manifold and the cold plates. Desirable height and contact interface pressures can be achieved for all the electronics components in a package regardless of height and orientation variations of the individual components, e.g., by adjusting the size of the biasing springs and flexible hoses coupling each cold plate to the manifold.

FIGS. 3A-3E depict one example of a cooled electronics system comprising cooling apparatus 300 coupled to an electronics assembly 310 for facilitating cooling thereof, in accordance with an aspect of the present invention. As shown, cooling apparatus 300 includes multiple discrete and rigid cold plates 320, each of which couples to a respective electronics component 314 disposed on a support structure 312. Each electronics component is a heat generating component, and as noted, may comprise a multichip module, single-chip module, or one or more unpackaged circuit die, etc., while structure 312 may comprise a planar board, stiffener or other rigid substrate.

Cold plates 320 are rigid structures to facilitate thermal interface of each forced cold plate and its respective electronics component. Coolant is fed to cold plates 320 in parallel from a common, rigid manifold 330 through compliant flexible hoses 340. In this example, manifold 330 includes a rigid lower manifold portion 332 and a rigid upper manifold portion 334, between which appropriate inlet and outlet plenums are defined, as described further below. A biasing mechanism, such as a plurality of springs 350, is disposed between the multiple cold plates 320 and the manifold 330 to bias the cold plates away from the manifold, and towards the electronics components 314, thereby ensuring good thermal interface between the cold plates and the electronics components, notwithstanding variation in height or angular orientation of the components relative to their support structure.

Figure 3A:
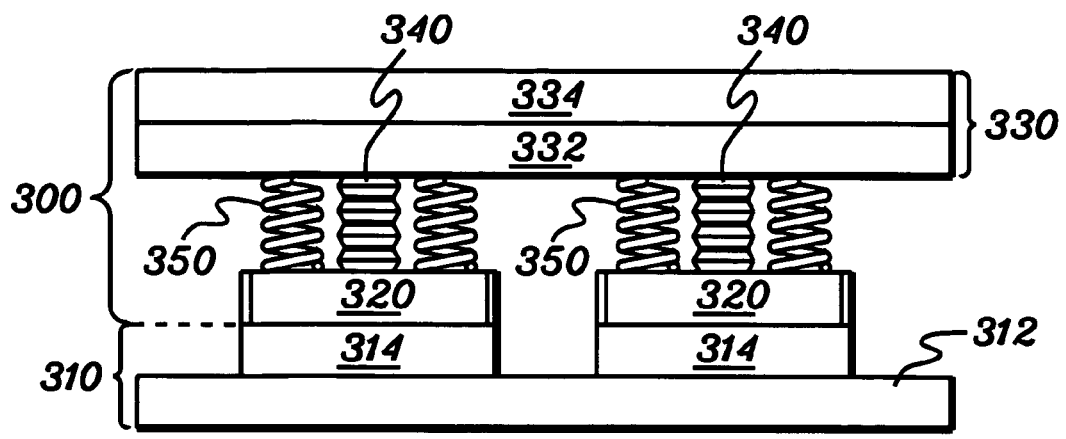
FIG. 3A is a partial elevational view of one embodiment of a cooling apparatus coupled to an electronics assembly, in accordance with an aspect of the present invention.
Figure 3B:
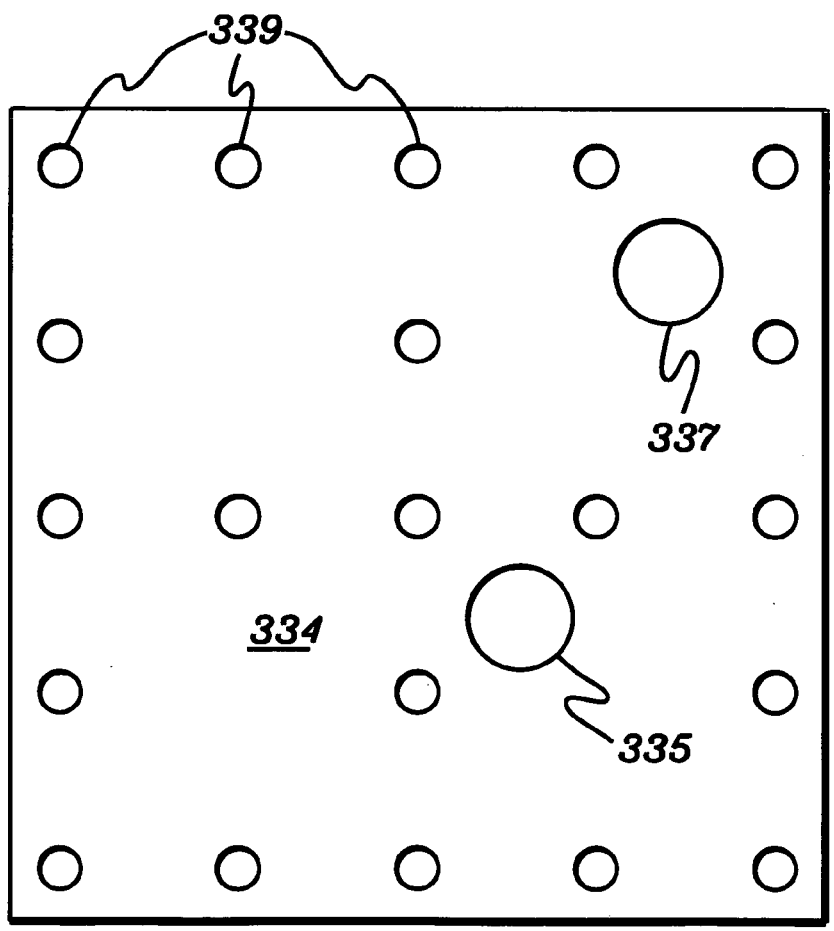
FIG. 3B is a top plan view of the cooling apparatus and electronics assembly of FIG. 3A, in accordance with an aspect of the present invention.

FIG. 3B depicts a top plan view of the cooling apparatus of FIG. 3A, showing upper manifold portion 334 to have a single coolant inlet 335 and a single coolant outlet 337. In this embodiment, a plurality of holes 339 are also provided which extend through the manifold and at least partially into the support structure to allow for one or more fasteners to secure the cooling apparatus to the support structure of the electronics assembly.

Figure 3C:
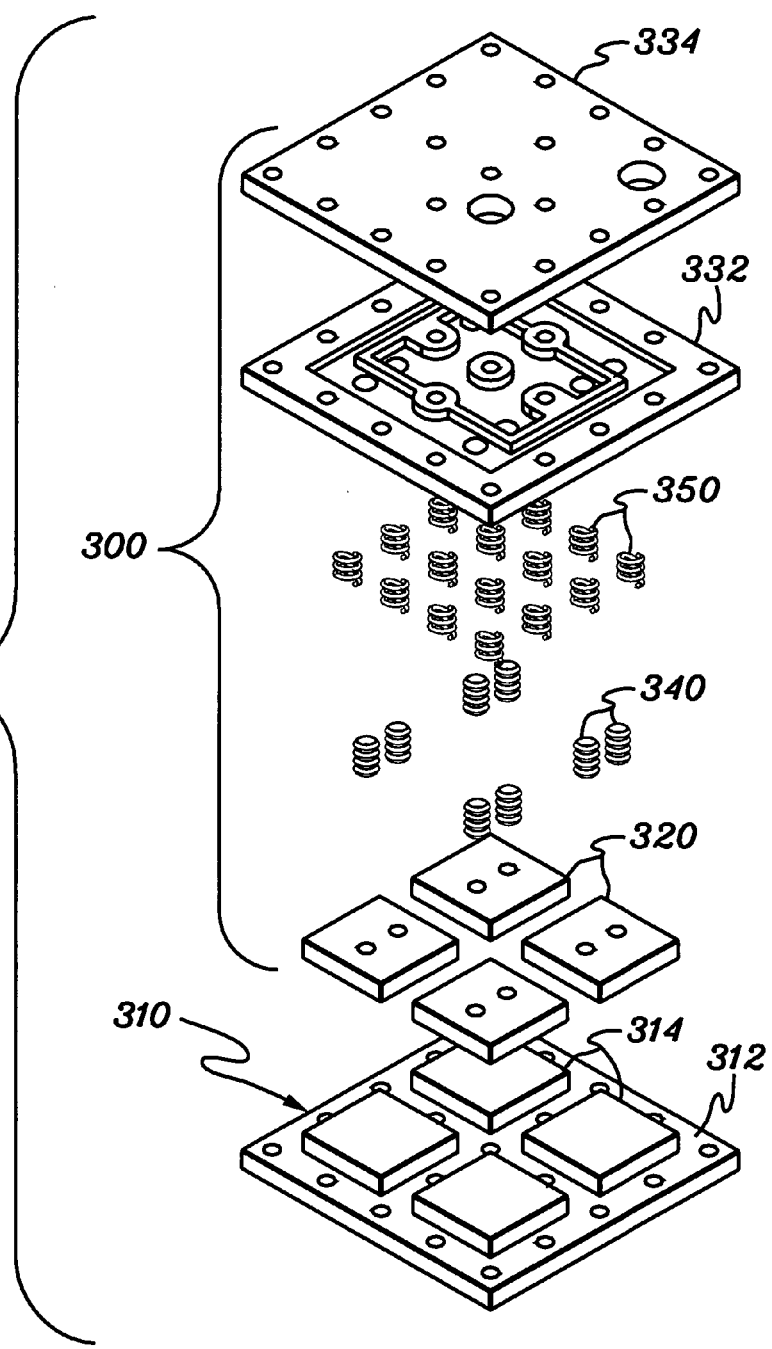
FIG. 3C is an exploded isometric view of the cooling apparatus and electronics assembly of FIG. 3A, in accordance with an aspect of the present invention.

FIG. 3C depicts an exploded view of cooling apparatus 300 shown disposed above electronics assembly 310. In this example, electronics assembly 310 includes support structure 312 and a 2×2 array of electronics components 314 requiring cooling. As noted, cooling apparatus 300 includes: multiple cold plates 320, each of which has at least one coolant inlet, at least one coolant outlet and at least one coolant channel for the flow of coolant therethrough; compliant flexible hoses 340, which provide a fluid-tight connection between the common manifold and the individual cold plates 320 while maintaining freedom of motion for the cold plates; and multiple springs 350, with four springs per cold plate being shown in this embodiment. Springs 350 are sized to provide a desired force against cold plates 320 to ensure a favorable thermal contact between each cold plate and its respective electronics component, as well as provide cold plate compliance which allows the components to vary in height and/or orientation within the electronics assembly. The common distribution manifold again includes, in this embodiment, lower manifold portion 332 and upper manifold portion 334 which are configured to seal together and define between them at least one inlet plenum and at least one outlet plenum. This manifold distributes coolant to the coolant inlets of the multiple cold plates and receives coolant from the coolant outlets of the multiple cold plates.

Figure 3D:
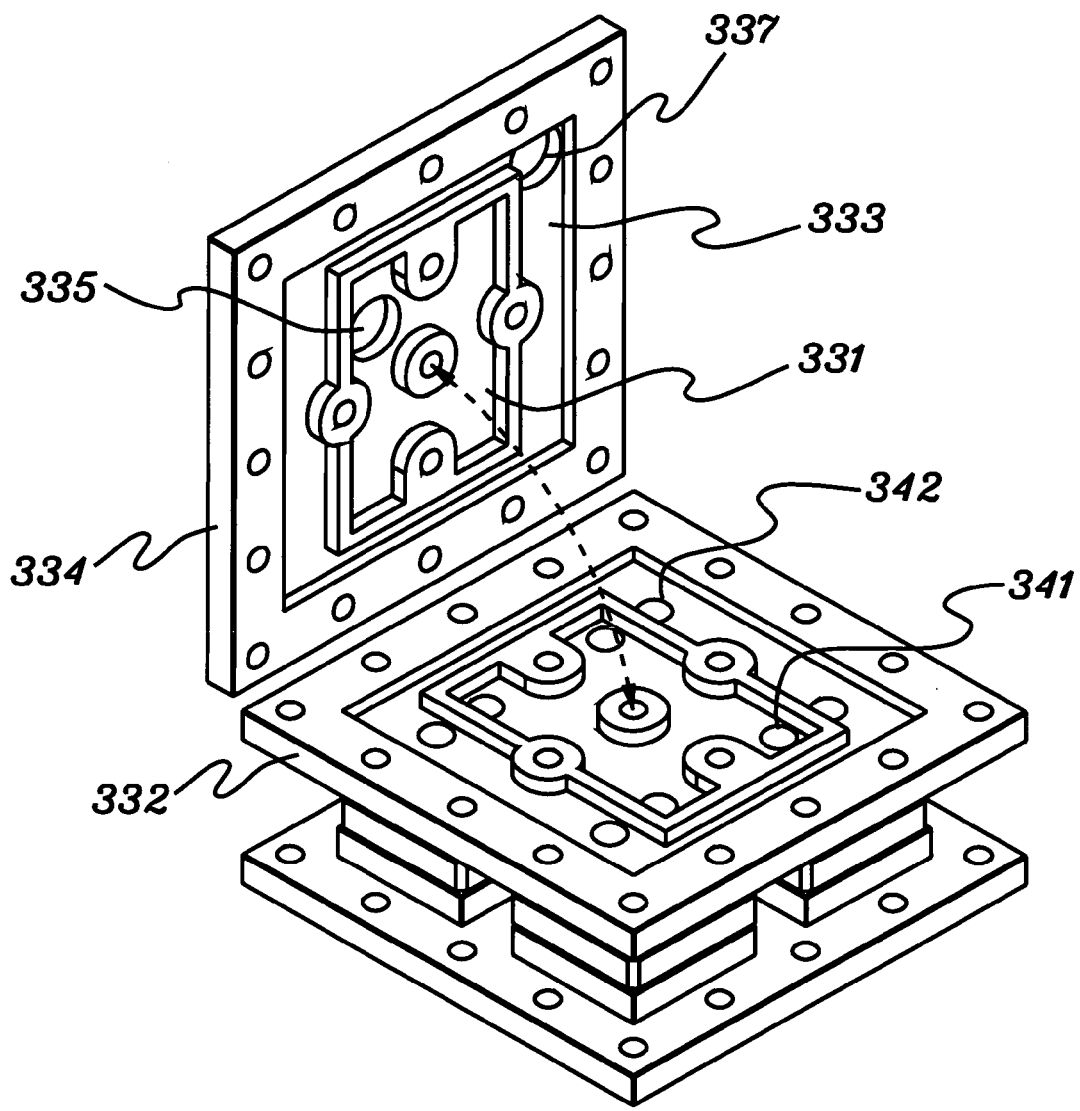
FIG. 3D is a partially assembled isometric view of the cooling apparatus and electronics assembly of FIG. 3A, showing the upper manifold portion removed to expose the inlet plenum and outlet plenum defined in the upper and lower manifold portions, in accordance with an aspect of the present invention.

FIG. 3D depicts the lower and upper manifold portions 332, 334 in greater detail. As shown, each manifold portion is designed with a similar interfacing relief structure, which together define a single inlet plenum 331 and a single outlet plenum 333. Coolant is fed through a single coolant inlet 335 in upper manifold portion 334 and is distributed to the cold plates via multiple cold plate coolant inlets 341 (and the flexible hoses) in fluid communication with inlet plenum 331. Similarly, outlet plenum 333 exhausts heated coolant through a single coolant outlet 337, and is in fluid communication with multiple cold plate coolant outlets 342, through which coolant is received from the cold plates.

Figure 3E:
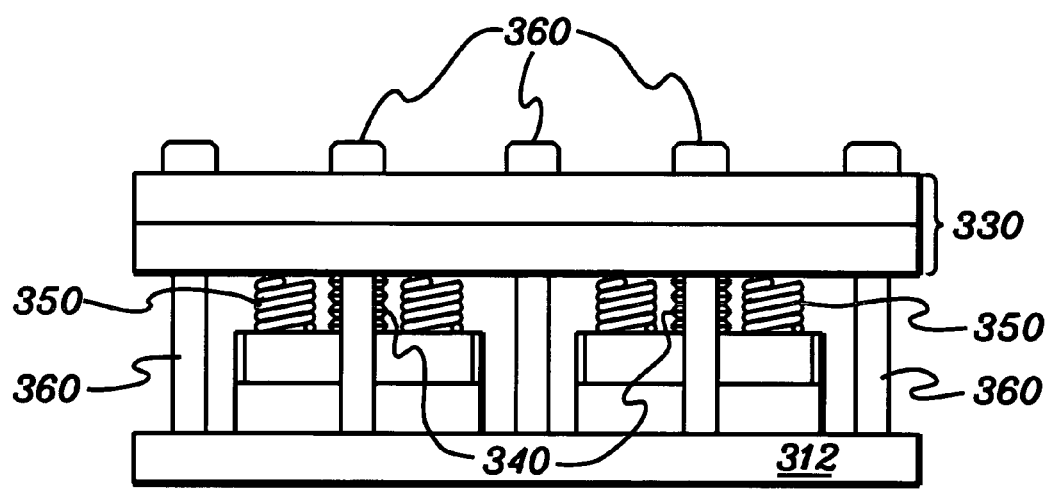
FIG. 3E is a side elevational view of the cooling apparatus and electronics assembly of FIG. 3A, showing fasteners securing the cooling apparatus to the electronics assembly, in accordance with an aspect of the present invention.

FIG. 3E is an elevational view of the cooling apparatus and electronics assembly of FIG. 3A, shown with fasteners 360 employed to secure cooling apparatus 330 to support structure 312 of the electronics assembly. Fasteners 360 secure manifold 330 to support structure 312 with sufficient pressure for springs 350 to at least partially compress (as well as compliant flexible hoses 340). By controlling compression of springs 350, the force the springs provide against their respective cold plates is controlled.

The cooling apparatus of the present invention can be configured to accommodate any n×n (or even n×m) array of electronics components disposed on a supporting structure. In FIGS. 4A-4D an electronics assembly 410 comprising a 4×4 array of electronics components 414 supported by a support structure 412 are shown. In this embodiment, cooling apparatus 400 again includes multiple rigid cold plates 420, each positioned and configured to interface with a respective electronics component 414 of the electronics assembly 410. A manifold 430, which distributes coolant through compliant flexible hoses 440 to each cold plate 420, again includes a lower manifold portion 432 and an upper manifold portion 434. A biasing mechanism, such as a plurality of springs 450, is employed in combination with fasteners 460 to controllably apply pressure to the individual cold plates to ensure good thermal contact of each cold plate with its respective electronics component.

Figure 4A:
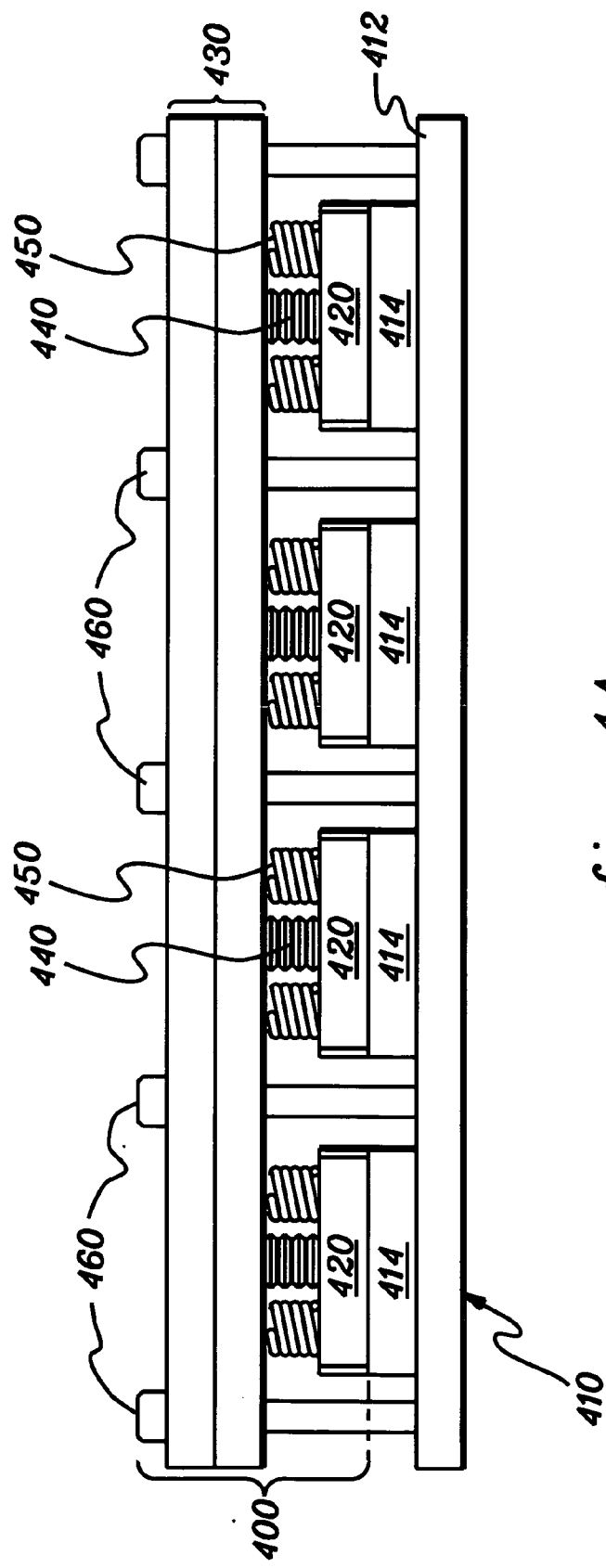
FIG. 4A is a side elevational view of another embodiment of a cooling apparatus coupled to an electronics assembly, in accordance with an aspect of the present invention.
Figure 4B:
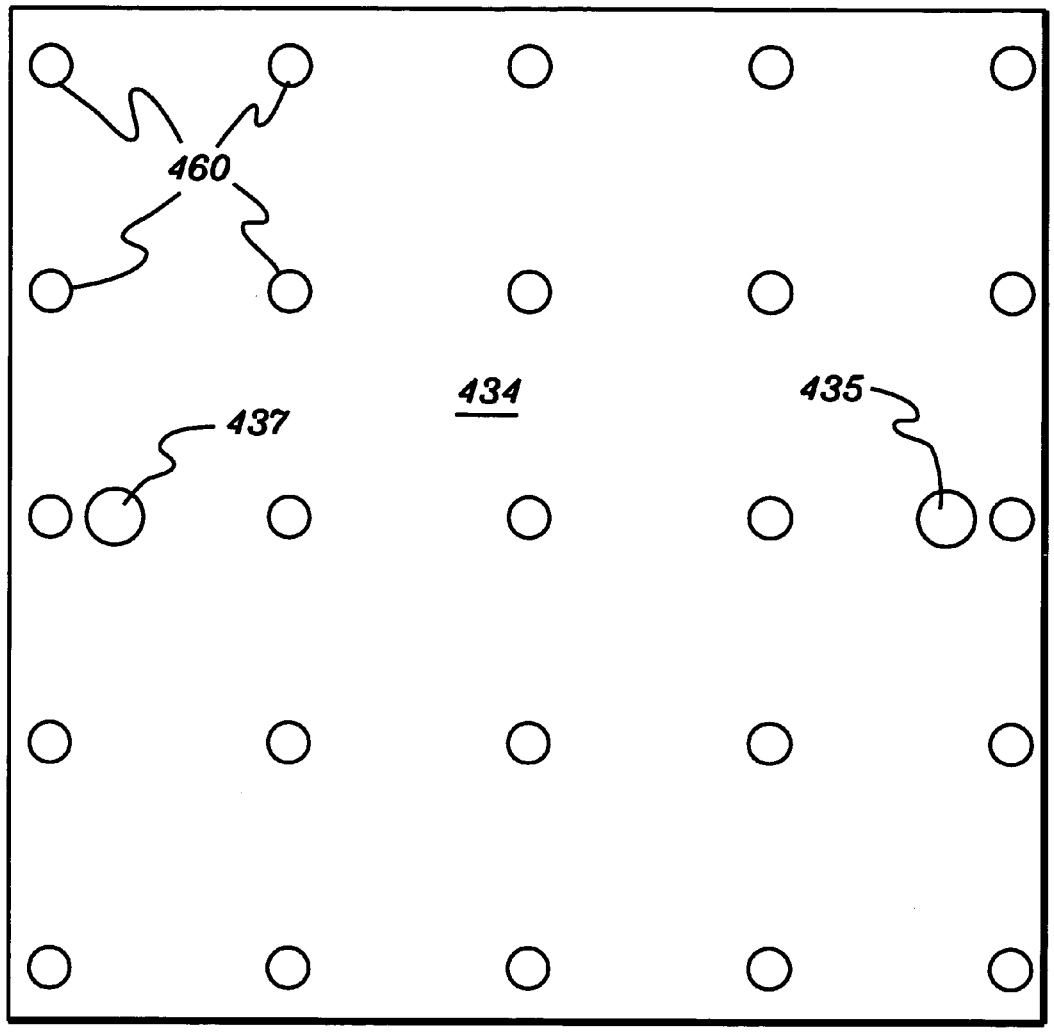
FIG. 4B is a top plan view of the cooling apparatus and electronics assembly of FIG. 4A, in accordance with an aspect of the present invention.
Figure 4D:
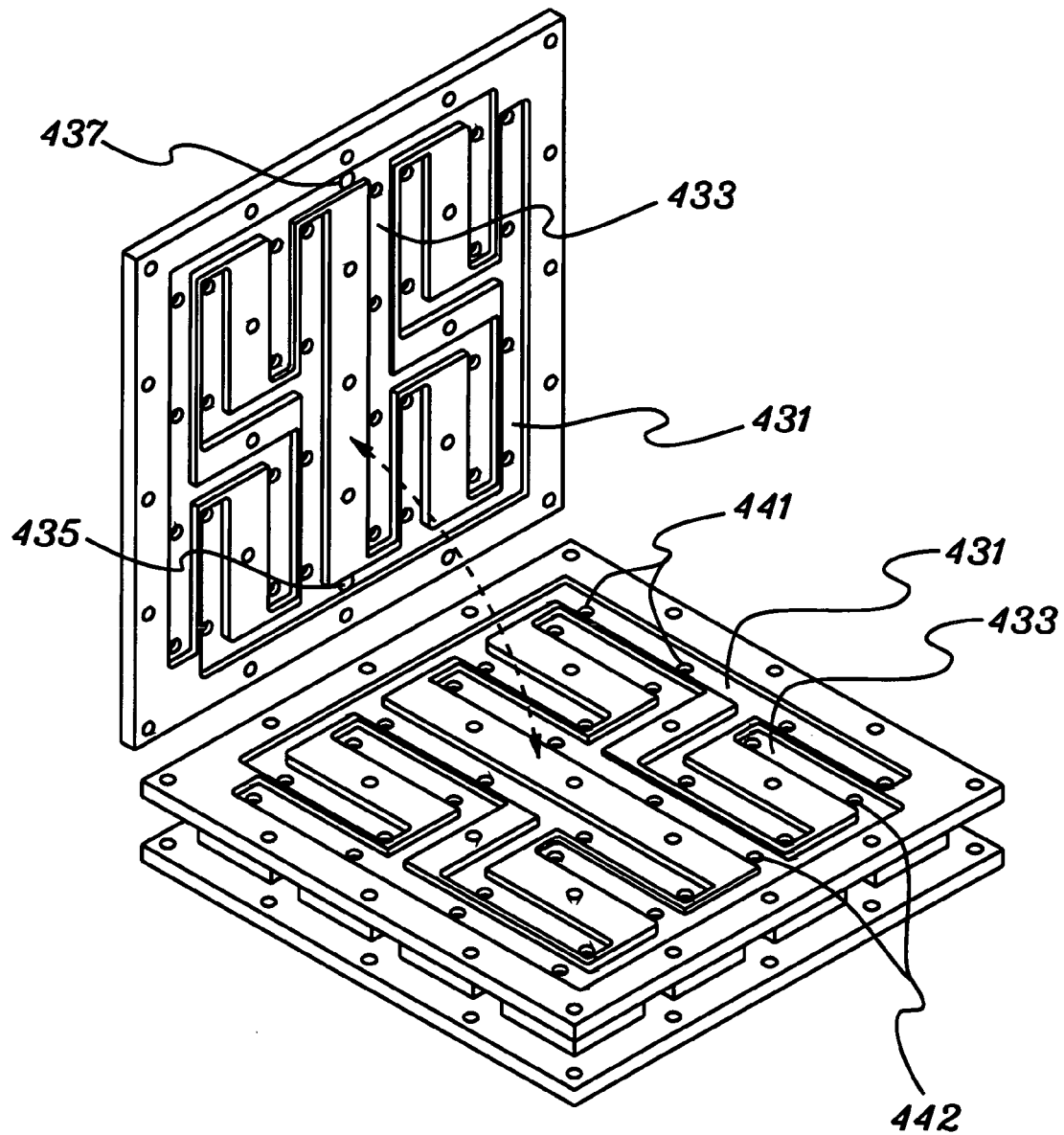
FIG. 4D is a partially assembled isometric view of the cooling apparatus of FIG. 4A, showing the upper manifold portion removed to expose the inlet plenum and outlet plenum defined in the upper and lower manifold portions, in accordance with an aspect of the present invention.

In the top plan view of FIG. 4B, upper manifold portion 434 is shown to include a single coolant inlet 435 and a single coolant outlet 437. Further, as shown in FIG. 4D, the manifold includes a single inlet plenum and a single outlet plenum, which are respectively in fluid communication with coolant inlet 435 and coolant outlet 437. Coolant is fed in parallel from the inlet plenum to each of the cold plates of the cooling apparatus, and extracted in parallel via the outlet plenum from each of the cold plates.

FIG. 4C is an exploded view of cooling apparatus 400, shown disposed above electronics assembly 410. As noted, cooling apparatus 400 includes multiple rigid cold plates 420, and a rigid manifold comprising lower manifold portion 432 and upper manifold portion 434. The cold plates are coupled to the manifold via respective flexible hoses 440, which provide parallel fluid communication between the inlet plenum of the manifold and the coolant carrying channels of the cold plates. A biasing mechanism (such as springs 450) is coupled to the cold plates and biases each cold plate away from the manifold so that when fasteners 460 secure the cooling apparatus to the electronics assembly 410, the biasing mechanism compresses and provides a controlled pressure against each cold plate to force each cold plate into good thermal coupling with its respective electronics component of the electronics assembly 410.

FIG. 4D depicts in detail one embodiment of the inlet and outlet plenums defined between the lower and upper manifold portions. In this embodiment, each cold plate is assumed to have a single coolant inlet and a single coolant outlet, and the cold plates are assumed to be in the same orientation with respect to the electronics assembly. This allows a system of passages to be designed in the manifold that can accommodate any number of electronics components in a symmetric pattern (2×2, 3×3, 4×4, etc.) by utilizing a unit cell approach. Note that a unit cell comprising the manifold section over one cold plate is adjacent to its mirror image, mirrored about the intersecting line between the cells. In the embodiment of FIG. 4D, a single inlet plenum 431 is defined, along with a single outlet plenum 433. A single coolant inlet 435 feeds coolant to inlet plenum 431, which distributes the coolant in parallel to the cold plates through respective cold plate coolant inlets 441 and flexible hoses in fluid communication with the inlet plenum. A single coolant outlet 437 exhausts coolant from the outlet plenum 433, which receives coolant via respective cold plate coolant outlets 442 and flexible hoses in fluid communication with the outlet plenum.

As a further enhancement to the cooling apparatuses described above, a cooling apparatus can be constructed having two or more independent and parallel cooling loops, e.g., by providing multiple inlet and outlet plenums in the common manifold, multiple inlet and outlet hoses to each cold plate, and multiple coolant channels within each cold plate. One embodiment of such a dual loop cooling apparatus is depicted in FIGS. 5A-5E. The two independent coolant loops in this embodiment are distributed in the manifold, run to each cold plate in parallel, and remain separated throughout the respective cold plates. These dual coolant loops, referred to herein as a primary coolant loop and a redundant, secondary coolant loop, can be connected to separate independent conditioned water sources, and each cold plate could be designed to allow for a doubling of coolant flow rate in one loop if the other loop were to fail.

Figure 5A:
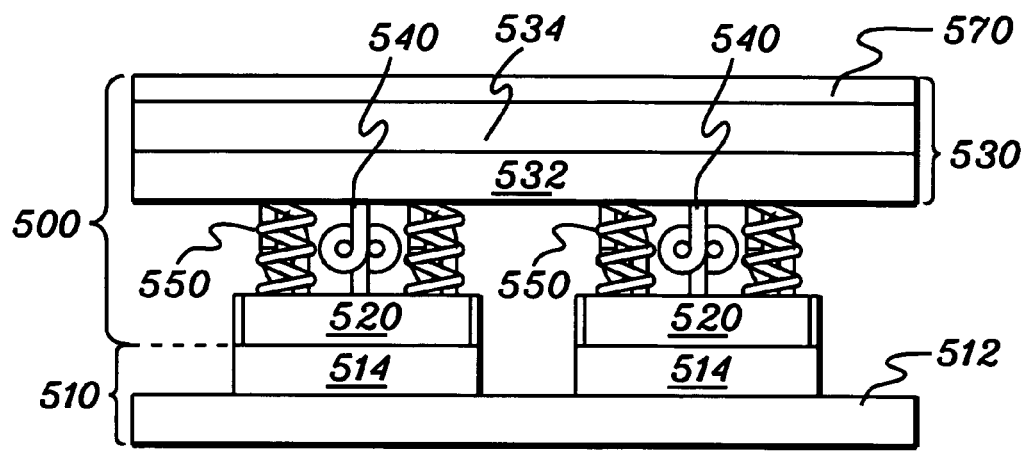
FIG. 5A is a partial elevational view of another embodiment of a cooling apparatus coupled to an electronics assembly, in accordance with an aspect of the present invention.

FIG. 5A depicts a partial elevational view of one embodiment of the dual loop cooling apparatus 500 coupled to an electronics assembly 510 for cooling multiple heat generating electronics components 514 thereof disposed on support structure 512. Cooling apparatus 500 includes multiple liquid cooled cold plates 520, each located and configured to couple to a respective electronics component of the electronics assembly. Coolant is provided in parallel to the cold plates 520 via a manifold 530, and multiple flexible coolant tubes 540, with each cold plate having two coolant inlet and two coolant outlet tubes 540. Note that in this embodiment, tubes 540 are preferably compliant flexible tubes which are looped between the manifold and the respective cold plate in order to allow for sufficient cold plate movement to accommodate variations in the electronics components to be cooled. In an alternate embodiment, the compliant looped tubes 540 could be replaced with a compliant compressible hose such as depicted with the embodiments of FIGS. 3A-4D. The phrase "hose segment" employed in the attached claims is intended to encompass either implementation, as well as other suitable hose/tube configurations. Manifold 530 includes a lower manifold 532, an upper manifold 534, and a cover plate 570. A biasing mechanism, such as springs 550, is disposed between the multiple cold plates 520 and the manifold 530 to bias the cold plates away from the manifold, and towards the electronics components to be cooled.

Figure 5B:
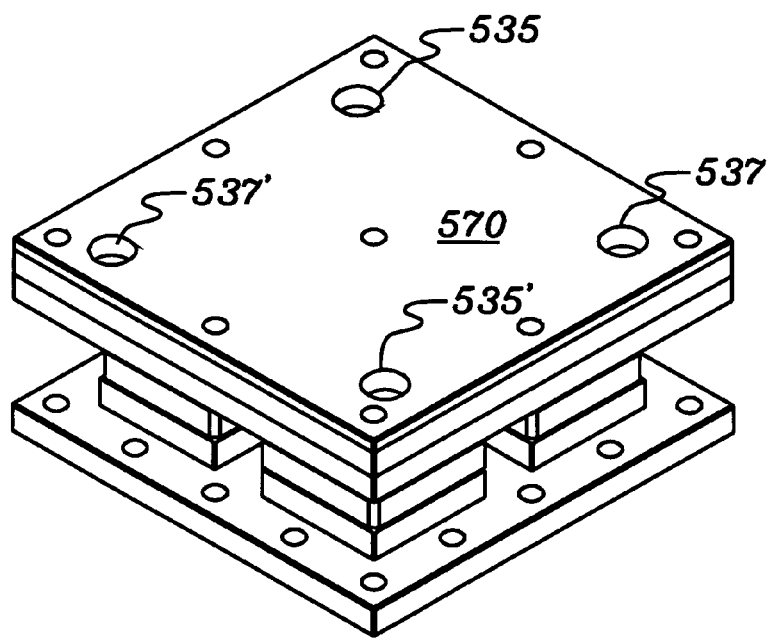
FIG. 5B is an isometric view of the cooling apparatus and electronics assembly of FIG. 5A, in accordance with an aspect of the present invention.

FIG. 5B is an isometric view of the partially assembled cooling apparatus and electronics assembly if FIG. 5A. In this embodiment, cover plate 570 is shown to include a primary coolant inlet 535 and a secondary coolant inlet 535', as well as a primary coolant outlet 537, and a secondary coolant outlet 537'. The primary coolant inlet 535 and primary coolant outlet 537 are associated with the primary coolant loop through the cooling apparatus, while the secondary coolant inlet 535' and the secondary coolant outlet 537' are associated with the secondary coolant loop through the cooling apparatus. Thus, external to the cooling apparatus, only four fluid connections (not shown) are required to operate the cooling apparatus in the dual loop configuration, which can significantly reduce the number of hoses otherwise required in an electronics rack. For example, if parallel cold plates were conventionally individually piped to a manifold, a 2×2 array would require 16 hoses, a 3×3 array would require 36 hoses, and a 4×4 array would require 64 hoses, etc. In addition to freeing space within the electronics rack, the dual loop cooling apparatus of FIGS. 5A-5E further allows compliance of the cold plates for both orientation and height differences among the electronics components, thereby allowing for optimum thermal contact between the components and the cold plates.

Figure 5C:
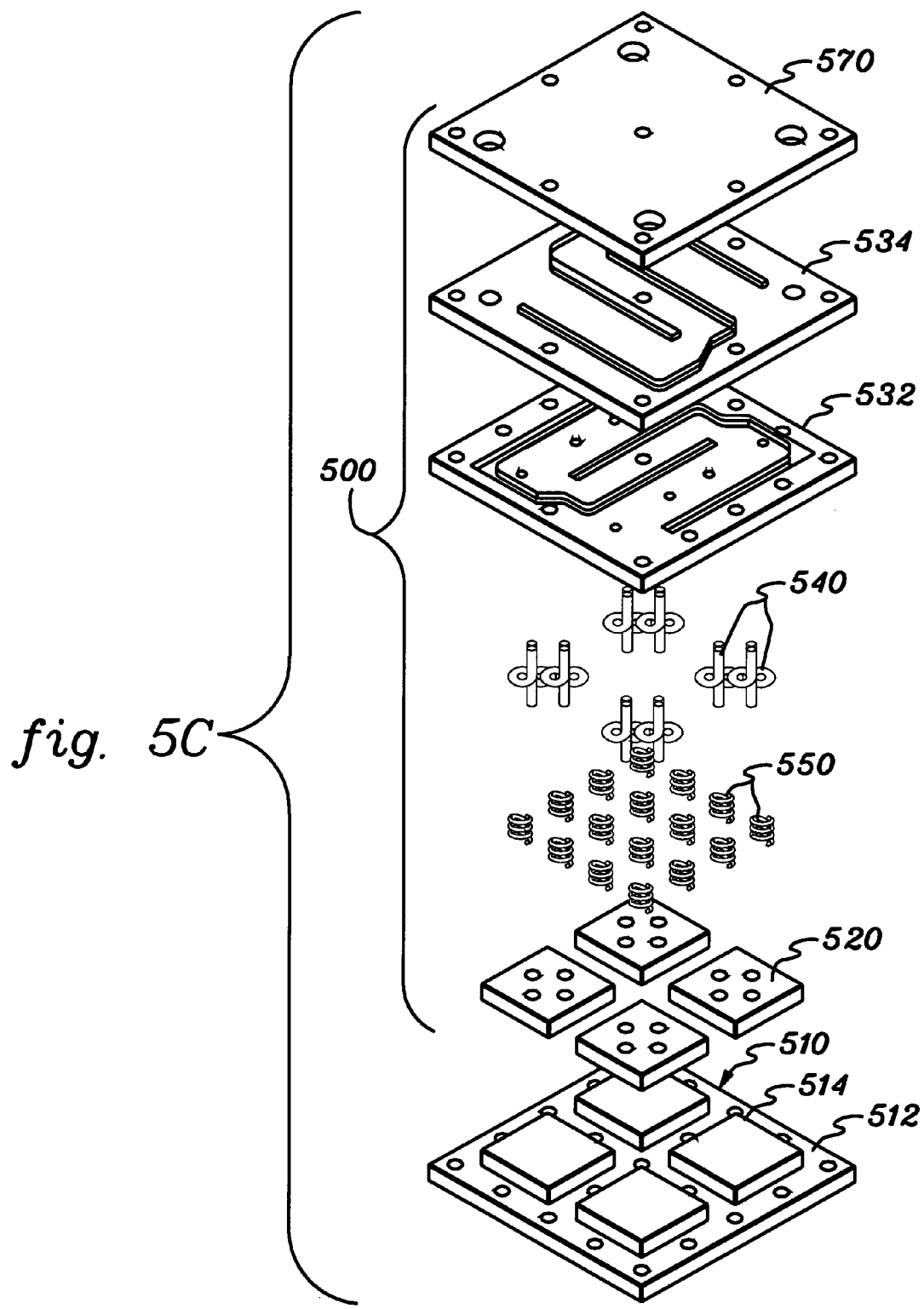
FIG. 5C is an exploded isometric view of the cooling apparatus and electronics assembly of FIG. 5A, in accordance with an aspect of the present invention.

FIG. 5C is an exploded view of the dual loop cooling apparatus 500, shown disposed above electronics assembly 510. In the illustrated embodiment, the electronics assembly includes a 2×2 array of electronics components 514 requiring cooling, shown disposed above support structure 512. The cooling apparatus includes four dual-loop cold plates 520, each sized and located for association with a respective electronics component to be cooled. As noted, two compliant inlet tubes 540 and two compliant outlet tubes 540 are provided for each dual-loop cold plate 520, which form respective portions of the primary and secondary coolant loops through the cooling apparatus. Each compliant tube couples to respective inlet and outlet plenums defined in lower manifold 532 and upper manifold 534. Cover plate 570 covers the plenums defined in upper manifold 534. Biasing mechanism 550 is again disposed between the manifold and the multiple cold plates to ensure biasing of the cold plates towards their associated electronics components.

Figure 5D:
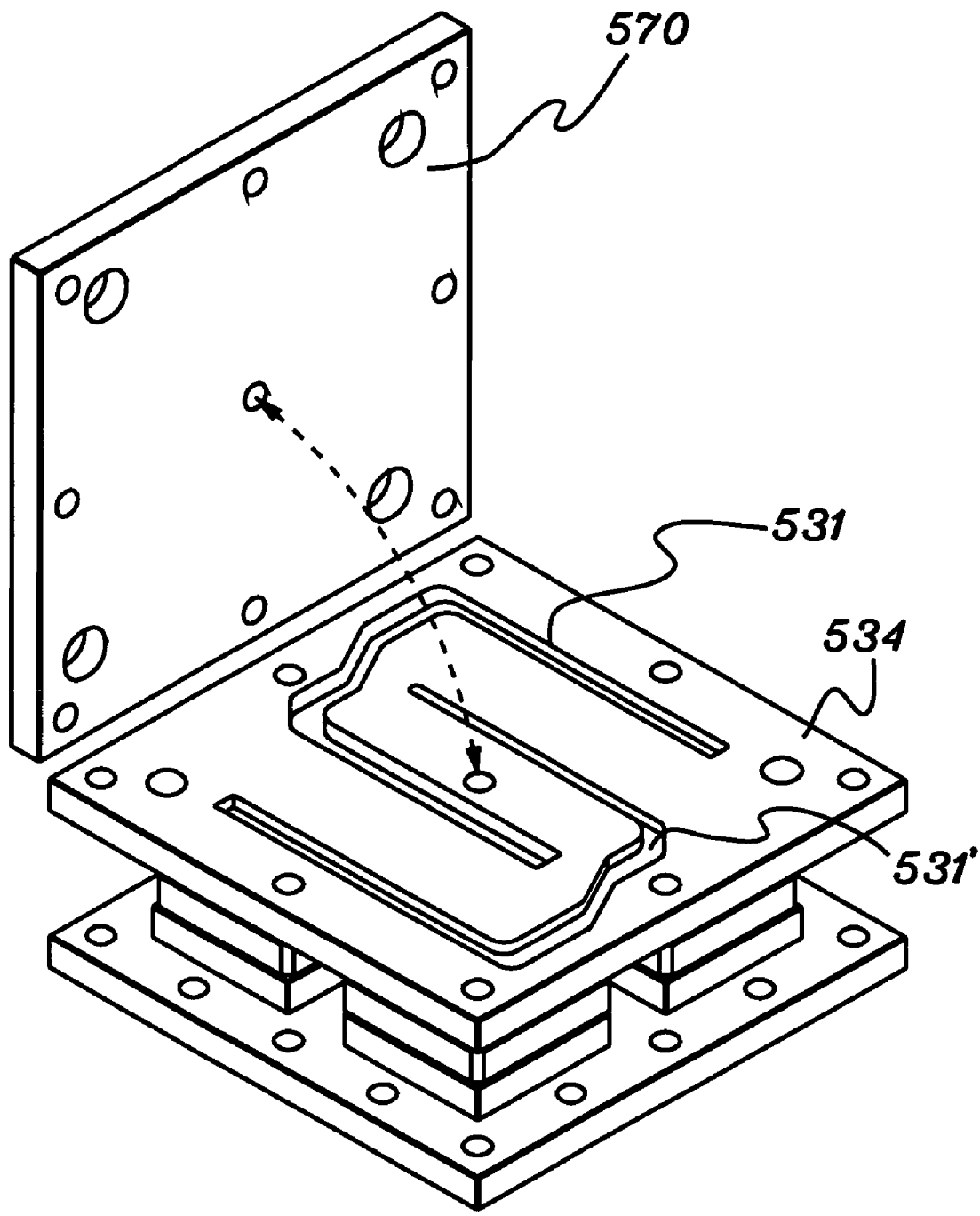
FIG. 5D is a partially assembled isometric view of the cooling apparatus and electronics assembly of FIG. 5A, showing the cover plate removed to expose separate primary and secondary coolant inlet plenums in the upper manifold, in accordance with an aspect of the present invention.

FIG. 5D shows a partially assembled view of the dual loop cooling apparatus of FIG. 5A, wherein cover 570 is pivoted up to expose a primary inlet plenum 531 and a secondary inlet plenum 531' formed in upper manifold 534. These inlet plenums 531, 531' are respectively in fluid communication with the primary coolant inlet and secondary coolant inlet illustrated in FIG. 5B, and each contain openings aligned with respective cold plate coolant inlets. As shown in this figure, the inlet plenums are separate and independent in order to provide the separate coolant loops through the cooling apparatus. The plenums may be defined by machining the upper manifold to provide the desired distribution channels. The primary and secondary coolant outlets are routed through the upper manifold 534 and cover plate 570 into the lower manifold as shown in FIG. 5E.

Figure 5E:
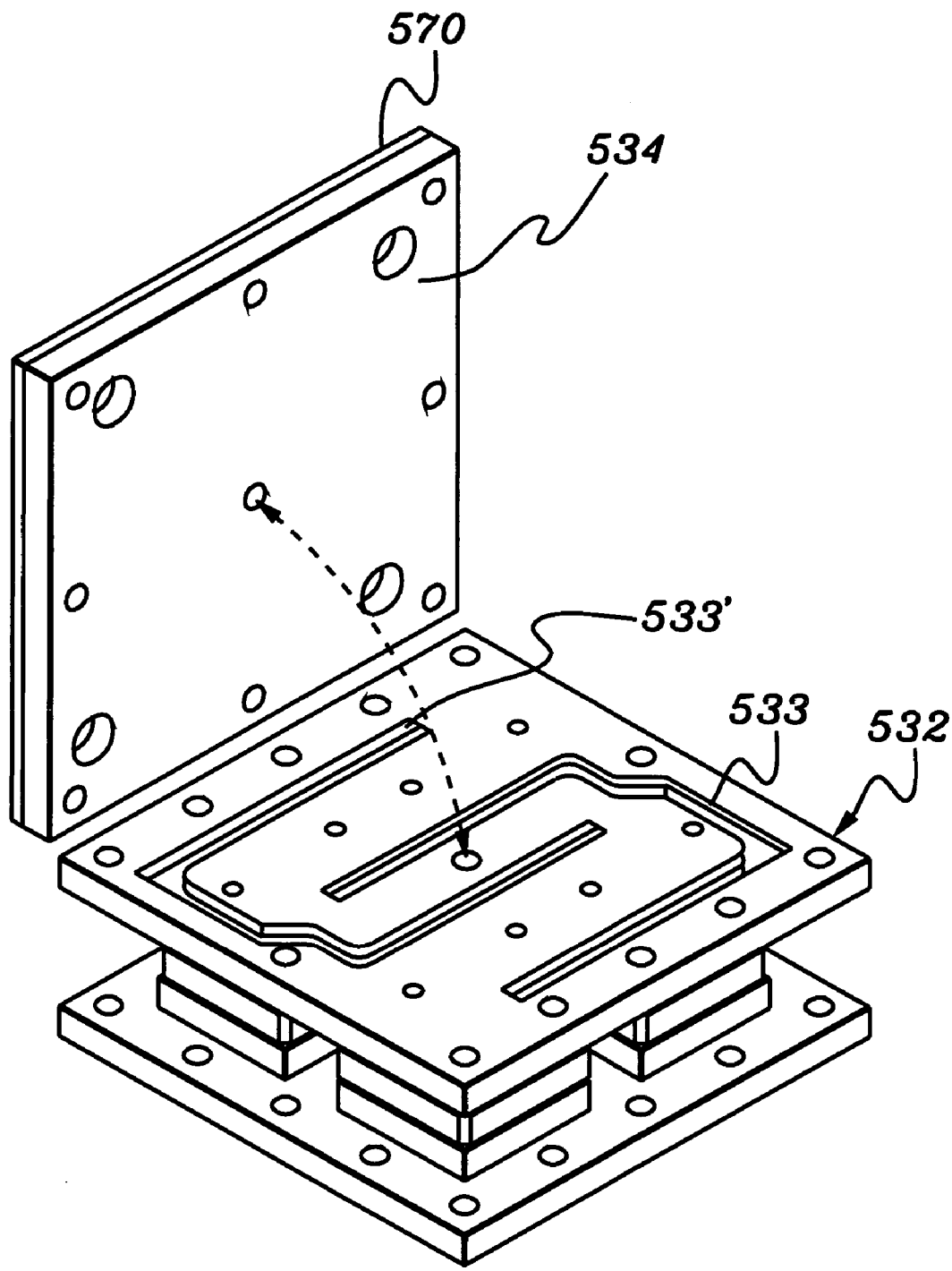
FIG. 5E is a partially assembled isometric view of the cooling apparatus and electronics assembly of FIG. 5A, showing the cover plate and upper manifold removed to expose separate primary and secondary coolant outlet plenums in the lower manifold, in accordance with an aspect of the present invention.

In FIG. 5E, both upper manifold 534 and cover plate 570 are removed to show a primary outlet plenum 533 and a secondary outlet plenum 533' formed in lower manifold 532. In this example, the lower manifold is machined with essentially the same flow passages as the upper manifold, only rotated 90 degrees, to provide the outlet plenums for the primary and secondary coolant outlets. Openings are provided in the primary and secondary plenums substantially aligned with the respective cold plate outlets formed in the multiple cold plates. These substantially aligned openings and outlets are in fluid communication through the compliant tubes 540 depicted in FIGS. 5A & 5C.

Figure 6:
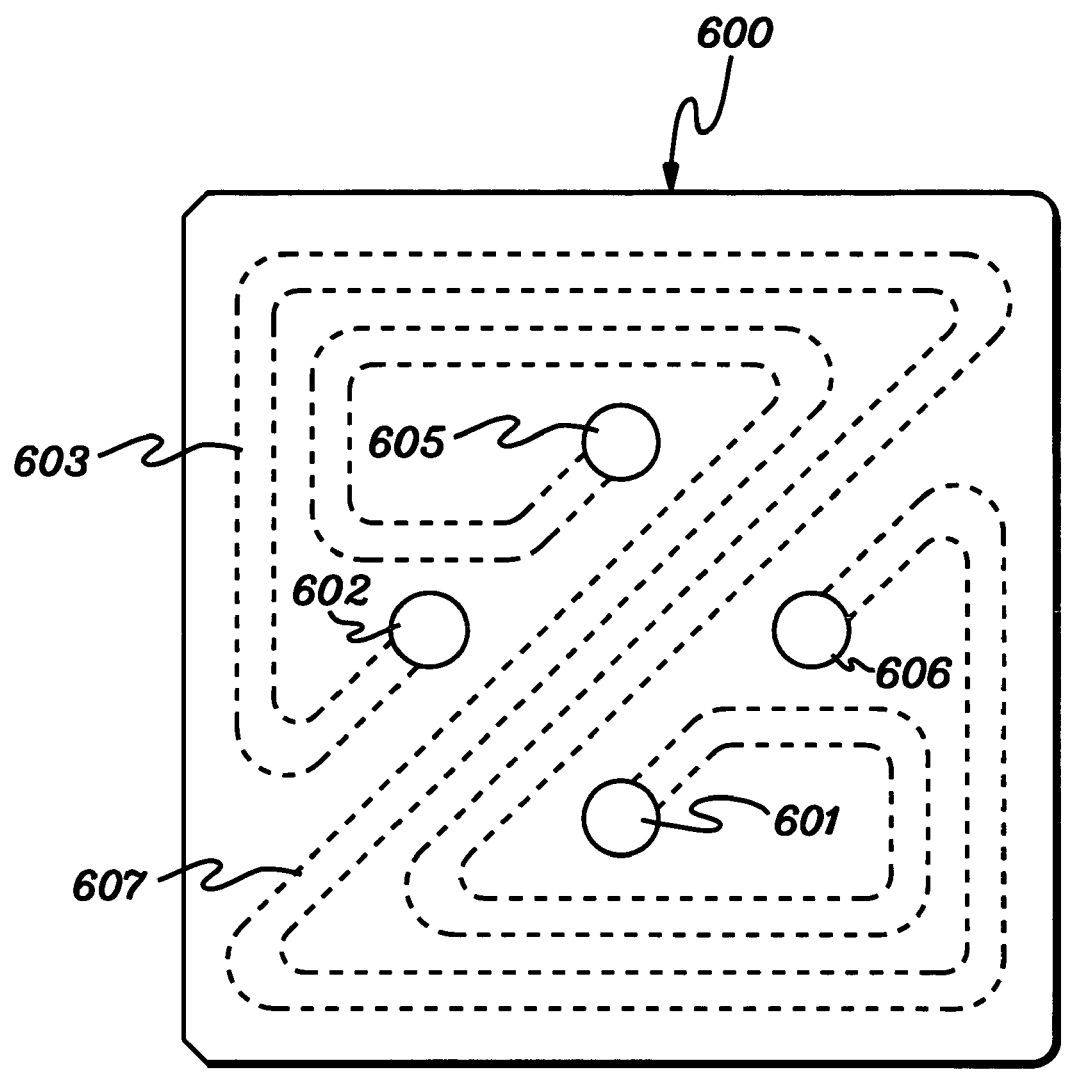
FIG. 6 is a top plan view of one embodiment of a cold plate which can be employed in a cooling apparatus such as depicted in FIGS. 5A-5E, in accordance with an aspect of the present invention.

FIG. 6 depicts one embodiment of a cold plate 600, useful in a cooling apparatus such as depicted in FIGS. 5A-5E. In this embodiment, cold plate 600 is a coolant-cooled cold plate configured with a primary coolant inlet 601 and a primary coolant outlet 602 with at least one coolant-carrying channel 603 disposed between the primary coolant inlet and a primary coolant outlet. Further, cold plate 600 includes a secondary coolant inlet 605 and a secondary coolant outlet 606 with at least one coolant-carrying channel 607 disposed between the secondary coolant inlet and the secondary coolant outlet. In one embodiment, channel 603 comprises a portion of the primary coolant loop through the cooling apparatus of FIGS. 5A-5E, while channel 607 comprises a portion of the redundant, secondary coolant loop. Various other cold plate embodiments may also be employed, including, for example, cold plates having multiple parallel channels disposed between the primary coolant inlet and primary coolant outlet, as well as multiple parallel channels between the secondary coolant inlet and the secondary coolant outlet. Further, each cold plate may comprise a micro-scaled cooling structure, with a characteristic dimension of 200 microns or less.

Those skilled in the art will note from the above discussion, that provided herein are various cooling apparatuses and methods of fabrication which employ a common distribution manifold and multiple cold plates in a parallel coolant flow path configuration through the cold plates. These cooling apparatuses allow for planar and angular misorientation of the individual electronics components to be cooled with respect to their support structure, and have in one embodiment, a single inlet and a single outlet per coolant loop through the cooling apparatus, thereby minimizing hoses to be routed through the next higher level of packaging. In the dual loop cooling apparatus configuration, two independent and parallel coolant paths are established through the cooling apparatus, employing only two inlets and two outlets to the common distribution manifold, regardless of the number of cold plates.

Further, provision of compliant hoses/tubes and a biasing mechanism(s) ensures control of the contact pressure between the cold plates and their respective electronics components. As a further enhancement, the size and coolant carrying capability of the hoses/tubes and the various cold plates can differ across the cold plates in order to customize the cooling capacity of the individual cold plates; for example, to provide higher coolant flow through capacity for higher heat generating components, and lower coolant flow through capacity for lower heat generating components of the electronics assembly. Those skilled in the art will appreciate that various techniques can be employed to modify the amount of coolant flow through the different cold plates.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling apparatus for facilitating cooling of an electronics assembly comprising a support structure supporting multiple heat generating electronics components to be cooled, the cooling apparatus comprising:
   multiple discrete cold plates, each cold plate being configured to couple to a respective electronics component of the multiple electronics components, and each cold plate being a coolant-cooled cold plate including a coolant inlet and a coolant outlet with at least one coolant carrying channel disposed between the coolant inlet and coolant outlet;
   a common manifold for distributing coolant to the coolant inlets of the multiple cold plates and for receiving coolant from the coolant outlets of the multiple cold plates;
   multiple flexible hose segments connecting in fluid communication the coolant inlets of the multiple cold plates to the manifold, and connecting in fluid communication the coolant outlets of the multiple cold plates to the manifold, each flexible hose segment being disposed between a respective cold plate and the manifold;
   at least one biasing mechanism disposed between the multiple cold plates and the manifold for biasing the multiple cold plates away from the manifold, and towards the multiple heat generating electronics components when the cooling apparatus is in use; and
   at least one fastener for securing the manifold to the support structure of the electronics, wherein the at least one fastener compresses the at least one biasing mechanism when in use, thereby forcing each cold plate towards its respective electronics component to ensure good thermal interface of the cold plate to the respective electronics components.

2. The cooling apparatus of claim 1, wherein at least one of height and angular orientation of at least some electronics components relative to the support structure vary, and wherein the flexible hose segments and at least one biasing mechanism accommodate the variation of the at least some electronics components when the cooling apparatus is in use.

3. The cooling apparatus of claim 1, wherein the manifold comprises a single coolant inlet plenum and a single coolant outlet plenum, and wherein the multiple flexible hose segments couple in parallel the coolant inlets of the multiple cold plates to the single coolant inlet plenum, and couple in parallel the coolant outlets of the multiple cold plates to the single coolant outlet plenum of the manifold.

4. The cooling apparatus of claim 1, wherein the at least one biasing mechanism is multiple spring biasing mechanisms, each spring biasing mechanism being coupled to a respective cold plate and being disposed between the manifold and a respective cold plate of the multiple cold plates.

5. The cooling apparatus of claim 1, wherein the manifold is a rigid structure, the support structure is a rigid, planar support structure, and the multiple electronics components each comprise at least one of a multichip electronics module, a single-chip electronics module or unpackaged electronics die.

6. The cooling apparatus of claim 1, wherein the manifold is a rigid structure configured with a coolant inlet plenum and a coolant outlet plenum, and includes a single inlet opening in fluid communication with the coolant inlet plenum and a single outlet opening in fluid communication with the coolant outlet plenum, wherein coolant is fed to the coolant inlet plenum through the single inlet opening and removed from the coolant outlet plenum via the single outlet opening.

7. The cooling apparatus of claim 6, wherein the manifold further includes a first set of openings in fluid communication with the coolant inlet plenum, each opening of the first set of openings also being in fluid communication via a respective flexible hose segment with an inlet opening of a cold plate of the multiple cold plates, and a second set of openings in fluid communication with the coolant outlet plenum, each opening in the second set of openings being in fluid communication via a respective flexible hose segment with an outlet opening of a cold plate of the multiple cold plates.

8. The cooling apparatus of claim 7, wherein the support structure is a planar support structure and the multiple electronics components are arrayed on the support structure, and wherein the manifold is configured with a single opening of the first set of openings and a single opening of the second set of openings each aligned over a respective, common cold plate of the multiple cold plates.

9. The cooling apparatus of claim 1, further comprising a primary coolant flow loop and a redundant, secondary coolant flow loop defined through the manifold, the flexible hose segments and the multiple cold plates, wherein each cold plate comprises two separate coolant carrying channels, each coolant carrying channel forming a portion of the respective primary and secondary coolant flow loops.

10. The cooling apparatus of claim 9, further comprising a primary coolant inlet plenum, a secondary coolant inlet plenum, a primary coolant outlet plenum and a secondary coolant outlet plenum defined within the manifold, and wherein respective flexible hose segments of the multiple flexible hose segments couple a primary inlet and a secondary inlet of each of the multiple cold plates to one of the primary coolant inlet plenum and the secondary coolant inlet plenum, and wherein respective flexible hose segments of the multiple flexible hose segments couple a primary outlet and a secondary outlet of each cold plate to one of the primary coolant outlet plenum and the secondary coolant outlet plenum, and wherein coolant separately flows through the primary coolant flow loop and the secondary coolant flow loop, and wherein the primary coolant inlet plenum is fed via a single primary coolant inlet in the manifold, the secondary coolant inlet plenum is fed via a single secondary coolant inlet in the manifold, the primary coolant outlet plenum is exhausted through a single primary coolant outlet in the manifold and the secondary coolant outlet plenum is exhausted through a single secondary coolant outlet in the manifold.

11. A cooled electronics system comprising:
an electronics assembly including a support structure supporting multiple heat generating electronics components to be cooled; and
a cooling apparatus for facilitating cooling of the electronics assembly, the cooling apparatus comprising:
multiple discrete cold plates, each cold plate being configured to couple to a respective electronics component of the multiple electronics components, and each cold plate being a coolant-cooled cold plate including a coolant inlet and a coolant outlet with at least one coolant carrying channel disposed between the coolant inlet and coolant outlet;
a common manifold for distributing coolant to the coolant inlets of the multiple cold plates and for receiving coolant from the coolant outlets of the multiple cold plates;
multiple flexible hose segments connecting in fluid communication the coolant inlets of the multiple cold plates to the manifold, and connecting in fluid communication the coolant outlets of the multiple cold plates to the manifold, each flexible hose segment being disposed between a respective cold plate and the manifold;
at least one biasing mechanism disposed between the multiple cold plates and the manifold for biasing the multiple cold plates away from the manifold, and towards the multiple heat generating electronics components when the cooling apparatus is in use; and
at least one fastener for securing the manifold to the support structure of the electronics assembly, wherein the at least one fastener compresses the at least one biasing mechanism when in use, thereby forcing each cold plate towards its respective electronics component to ensure good thermal interface of the cold plate to the respective electronics components.

12. The cooled electronics system of claim 11, wherein at least one of height and angular orientation of at least some electronics components relative to the support structure vary, and wherein the flexible hose segments and at least one biasing mechanism accommodate the variation of the at least some electronics components when the cooling apparatus is in use.

13. The cooled electronics system of claim 11, wherein the manifold comprises a single coolant inlet plenum and a single coolant outlet plenum, and wherein the multiple flexible hose segments couple in parallel the coolant inlets of the multiple cold plates to the single coolant inlet plenum, and couple in parallel the coolant outlets of the multiple cold plates to the single coolant outlet plenum of the manifold.

14. The cooled electronics system of claim 11, wherein the at least one biasing mechanism is multiple spring biasing mechanisms, each spring biasing mechanism being coupled to a respective cold plate and being disposed between the manifold and a respective cold plate of the multiple cold plates.

15. The cooled electronics system of claim 11, wherein the manifold is a rigid structure, the support structure is a rigid, planar support structure, and the multiple electronics components each comprise at least one of a multichip electronics module, a single-chip electronics module or unpackaged electronics die.

16. The cooled electronics system of claim 11, further comprising a primary coolant flow loop and a redundant, secondary coolant flow loop defined through the manifold, the flexible hose segments and the multiple cold plates, wherein each cold plate comprises two separate coolant carrying channels, each coolant carrying channel forming a portion of the respective primary and secondary coolant flow loops.

17. The cooled electronics system of claim 16, further comprising a primary coolant inlet plenum, a secondary coolant inlet plenum, a primary coolant outlet plenum and a secondary coolant outlet plenum defined within the manifold, and wherein respective flexible hose segments of the multiple flexible hose segments couple a primary inlet and a secondary inlet of each of the multiple cold plates to one of the primary coolant inlet plenum and the secondary coolant inlet plenum, and wherein respective flexible hose segments of the multiple flexible hose segments couple a primary outlet and a secondary outlet of each cold plate to one of the primary coolant outlet plenum and the secondary coolant outlet plenum, and wherein coolant separately flows through the primary coolant flow loop and the secondary coolant flow loop, and wherein the primary coolant inlet plenum is fed via a single primary coolant inlet in the manifold, the secondary coolant inlet plenum is fed via a single secondary coolant inlet in the manifold, the primary coolant outlet plenum is exhausted through a single primary coolant outlet in the manifold and the secondary coolant outlet plenum is exhausted through a single secondary coolant outlet in the manifold.

18. A method of fabricating a cooling apparatus for facilitating cooling of an electronics assembly comprising a support structure supporting multiple heat generating electronics components to be cooled, the method comprising:

providing multiple discrete cold plates, each cold plate being configured to couple to a respective electronics component of the multiple electronics components, and each cold plate being a coolant-cooled cold plate including a coolant inlet and a coolant outlet with at least one coolant carrying channel disposed between the coolant inlet and coolant outlet;

providing a common manifold for distributing coolant to the coolant inlets of the multiple cold plates and for receiving coolant from the cooling outlets of the multiple cold plates;

coupling the multiple cold plates to the manifold employing multiple flexible hose segments to connect in fluid communication the coolant inlets of the multiple cold plates to the manifold and the coolant outlets of the multiple cold plates to the manifold;

employing a biasing mechanism coupled to the multiple cold plates to bias the multiple cold plates away from the manifold, and towards the multiple heat generating electronics components when the cooling apparatus is in use; and securing the manifold to the support structure of the electronics assembly and compressing the biasing mechanism, thereby forcing each cold plate towards its respective electronics component to ensure good thermal interface of the cold plate to its respective electronics component.

19. The method of claim 18, wherein at least one of height and angular orientation of at least some electronics components relative to the support structure vary, and wherein the flexible hose segments and at least one biasing mechanism accommodate the variation of the at least some electronics components when the cooling apparatus is in use.

20. The method of claim 18, further comprising selecting the biasing mechanism and controlling the securing to control the forcing of the cold plates towards their respective electronics components when the cooling apparatus is in use.

* * * * *